United States Patent
Horibe

(10) Patent No.: US 10,170,443 B1
(45) Date of Patent: Jan. 1, 2019

(54) DEBONDING CHIPS FROM WAFER

(71) Applicant: INTERNATIONAL BUSINESS MACHINES CORPORATION, Armonk, NY (US)

(72) Inventor: Akihiro Horibe, Kanagawa-ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/824,314

(22) Filed: Nov. 28, 2017

(51) Int. Cl.
*B32B 43/00* (2006.01)
*H01L 23/00* (2006.01)
*H01L 21/683* (2006.01)
*B32B 38/10* (2006.01)

(52) U.S. Cl.
CPC .......... *H01L 24/799* (2013.01); *B32B 43/006* (2013.01); *H01L 21/6835* (2013.01); *H01L 24/98* (2013.01); *B32B 38/10* (2013.01); *B32B 2457/14* (2013.01); *Y10T 156/1132* (2015.01); *Y10T 156/1137* (2015.01); *Y10T 156/1939* (2015.01); *Y10T 156/1944* (2015.01)

(58) Field of Classification Search
CPC . B32B 38/10; B32B 43/006; Y10T 156/1132; Y10T 156/1137; Y10T 156/1939; Y10T 156/1944
USPC ................ 156/707, 708, 757, 758
See application file for complete search history.

(56) References Cited

U.S. PATENT DOCUMENTS

| | | | |
|---|---|---|---|
| 6,554,046 B1 * | 4/2003 | Bryan | B28D 5/0011 156/581 |
| 6,997,226 B2 * | 2/2006 | Anker | H01L 21/67092 156/540 |
| 8,551,291 B2 * | 10/2013 | George | H01L 21/67092 156/580 |
| 8,997,822 B2 * | 4/2015 | Iwashita | H01L 21/67092 156/701 |
| 2012/0080832 A1 * | 4/2012 | Woodard | B23Q 3/084 269/289 R |
| 2012/0193216 A1 * | 8/2012 | Endo | C23C 14/50 204/192.1 |
| 2013/0133838 A1 * | 5/2013 | Kim | B32B 37/00 156/707 |

(Continued)

OTHER PUBLICATIONS

Tang, H. et al., "High Throughput Air Jetting Wafer Debonding for 3D IC and MEMS Manufacturing" 2016 IEEE 66th Electronic Components and Technology Conference (ECTC) (May 2016) pp. 1-7.

*Primary Examiner* — Mark A Osele
*Assistant Examiner* — Nickolas R Harm
(74) *Attorney, Agent, or Firm* — Tutunjian & Bitetto, P.C.; Vazken Alexanian

(57) ABSTRACT

A debonding device includes a first member provided with a recess for receiving a carrier body, the carrier body including a first plate, a second plate, and plural semiconductor chips. The semiconductor chips are sandwiched between the first plate and the second plate, the first plate of the carrier body received in the recess being opposed to a bottom of the recess. A second member is configured to change a relative position with respect to the first member, wherein the second member holds the second plate of the carrier body received in the recess using a vacuum suction, and the first member is provided with an inlet to introduce gas into a gap between the first plate and the second plate of the carrier body received in the recess.

12 Claims, 11 Drawing Sheets

(56) References Cited

U.S. PATENT DOCUMENTS

| | | | |
|---|---|---|---|
| 2014/0158306 A1* | 6/2014 | Lu | B32B 43/006 |
| | | | 156/752 |
| 2015/0083342 A1 | 3/2015 | George et al. | |
| 2015/0319893 A1* | 11/2015 | Ohno | B32B 43/006 |
| | | | 156/702 |
| 2016/0018587 A1* | 1/2016 | Koraishy | G02B 6/0065 |
| | | | 156/708 |
| 2017/0077062 A1 | 3/2017 | Huang et al. | |

* cited by examiner

DEBONDING CHIPS FROM WAFER

BACKGROUND

Technical Field

The present invention relates to debonding chips from a wafer.

Related Art

Recently, various techniques have been known regarding debonding chips from a wafer.

SUMMARY

According to an embodiment of the present invention, there is provided a debonding device. The debonding device includes a first member and a second member. The first member is provided with a recess for receiving a carrier body. The carrier body includes a first plate, a second plate, and plural semiconductor chips. The semiconductor chips are sandwiched between the first plate and the second plate. The first plate of the carrier body received in the recess is opposed to a bottom of the recess. The second member is configured to change a relative position with respect to the first member. The second member holds the second plate of the carrier body received in the recess of the first member using a vacuum suction in a position close to the first member. The first member is provided with an inlet to introduce gas into a gap between the first plate and the second plate of the carrier body received in the recess of the first member.

According to another embodiment of the present invention, there is provided a semiconductor manufacturing system. The semiconductor manufacturing system includes a debonding device and a bonding device. The debonding device is configured to debond plural semiconductor chips in a carrier body. The carrier body includes a first plate, a second plate, and the plural semiconductor chips being sandwiched between the first plate and the second plate. The bonding device is configured to bond the plural semiconductor chips on substrates. The debonding device includes a first member and a second member. The first member is provided with a recess for receiving the carrier body. The first plate of the carrier body received in the recess is opposed to a bottom of the recess. The second member is configured to change a relative position with respect to the first member. The second member holds the second plate of the carrier body received in the recess of the first member using a vacuum suction in a position close to the first member. The first member is provided with an inlet to introduce gas into a gap between the first plate and the second plate of the carrier body received in the recess of the first member.

According to yet another embodiment of the present invention, there is provided a method for debonding plural semiconductor chips. The method includes receiving a carrier body in a recess provided in a first member. The carrier body includes a first plate, a second plate, and the plural semiconductor chips. The semiconductor chips are sandwiched between the first plate and the second plate. The first plate of the carrier body received in the recess is opposed to a bottom of the recess. The method further includes moving at least one of the first member and a second member closer to each other. The method further includes holding the second plate of the carrier body received in the recess of the first member by the second member using a vacuum suction. The method further includes blowing gas into a gap between the first plate and the second plate of the carrier body received in the recess of the first member.

DETAILED DESCRIPTION

Hereinafter, exemplary embodiments of the present invention will be described in detail with reference to the attached drawings.

It is to be noted that the present invention is not limited to these exemplary embodiments to be given below and may be implemented with various modifications within the scope of the present invention. In addition, the drawings used herein are for purposes of illustration, and may not show actual dimensions.

Figure 1:
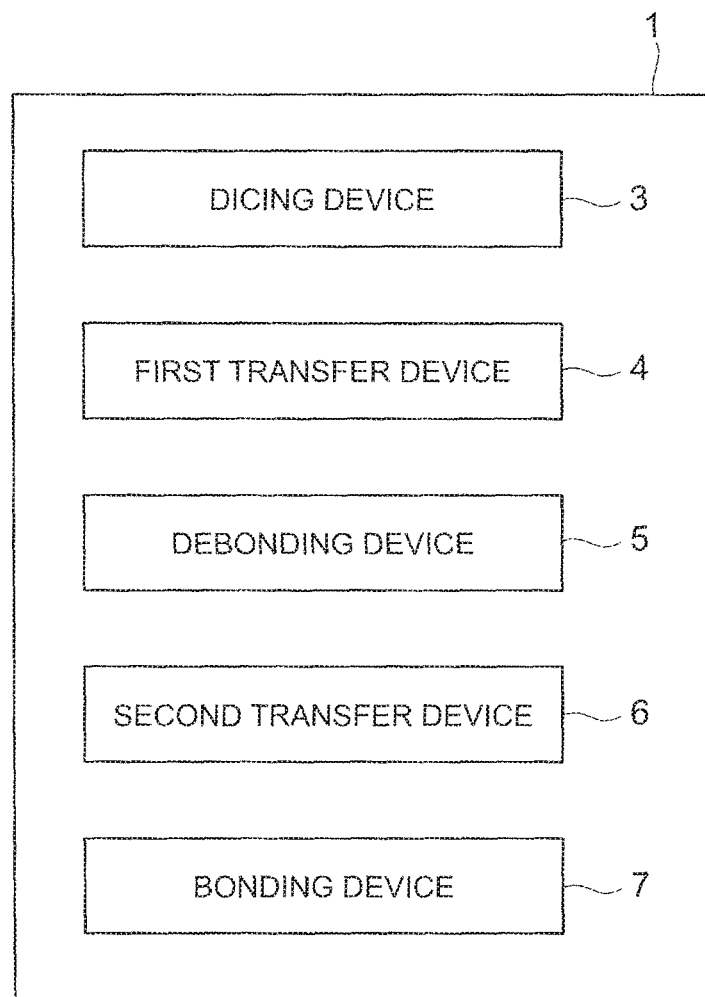
FIG. 1 depicts a block diagram showing a configuration of a semiconductor manufacturing system according to an exemplary embodiment of the present invention.

FIG. 1 depicts a block diagram showing a configuration of a semiconductor manufacturing system 1 according to an exemplary embodiment of the present invention.

As shown in FIG. 1, the semiconductor manufacturing system 1 may include a dicing device 3, a first transfer device 4, a debonding device 5, a second transfer device 6, and a bonding device 7. The semiconductor manufacturing system 1 manufactures semiconductors using a wafer level packaging process.

The dicing device 3 cuts a wafer into individual semiconductor chips. The dicing device 3 cuts the wafer by reactive ion etching. In the dicing device 3, the wafer is mounted on a support member (a first wafer support WS1, described later).

The first transfer device 4 transfers the semiconductor chips from the dicing device 3 to the debonding device 5.

The debonding device 5 debonds the semiconductor chips from the first wafer support WS1. In other words, the debonding device 5 picks up the semiconductor chips from the first wafer support WS1.

The second transfer device 6 transfers the semiconductor chips from the debonding device 5 to the bonding device 7.

The bonding device 7 bonds the semiconductor chips transferred by the second transfer device 6 to corresponding substrates. In other words, the bonding device 7 mounts the semiconductor chips on the corresponding substrates.

Next, an explanation is given about a fabrication process of a semiconductor according to the exemplary embodiment.

Figure 2A:
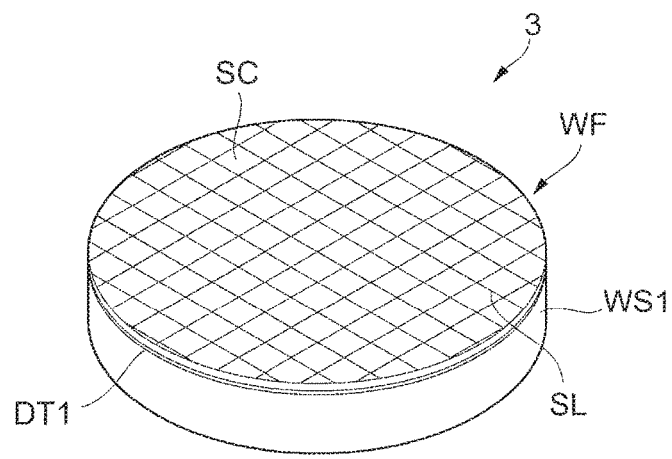
FIGS. 2A and 2B depict a schematic view and a sectional side view, respectively, of semiconductor chips at the first step of the fabrication process according to the exemplary embodiment.
Figure 2B:
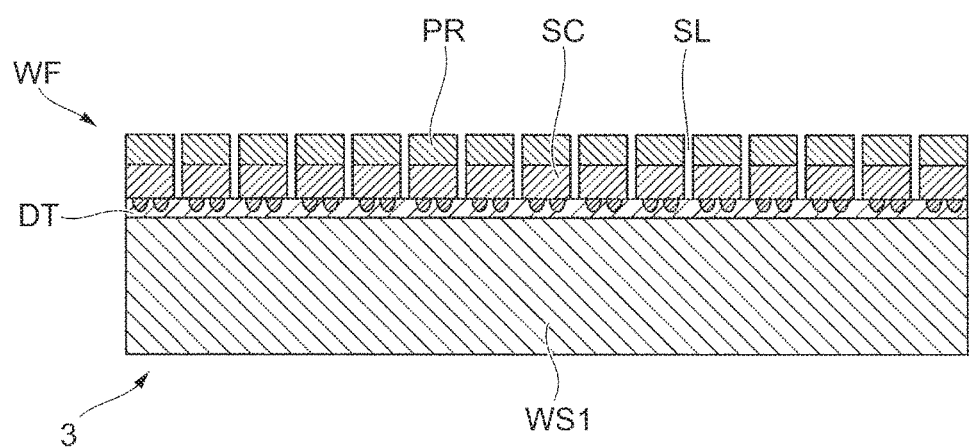

Referring to FIGS. 2A and 2B, there are shown a schematic view and a sectional side view, respectively, of the semiconductor chips SC at the first step of the fabrication process according to the exemplary embodiment. At this step, a wafer WF is cut into individual semiconductor chips SC. More specifically, a photo resist PR is provided on a surface of the wafer WF and the wafer WF is cut by reactive ion etching. The wafer WF is held by the first wafer support WS1 with a first dicing tape DT1. The first wafer support WS1 is a glass substrate (plate) transmitting ultraviolet (UV) light. The first dicing tape DT1 is provided with a UV-curable adhesive. After the wafer WF is cut, the photo resist PR is removed by ashing, for example.

Note that the semiconductor chips SC are provided in an array on the first wafer support WS1. Each semiconductor chip SC has a generally rectangular shape in a plane view. An etched area provided on the surface of the wafer WF has a lattice shape. In other words, the etched area has two sets of lines crossing each other. The etched area is hereinafter called "scribed lines SL". The size of each semiconductor chip SC is less than 5 mm, preferably less than 1 mm, more preferably 50 um to 500 um (micro meter). Further, the width of each line of the scribed lines SL is 3 um to 50 um, preferably 5 um to 20 um.

Figure 3A:
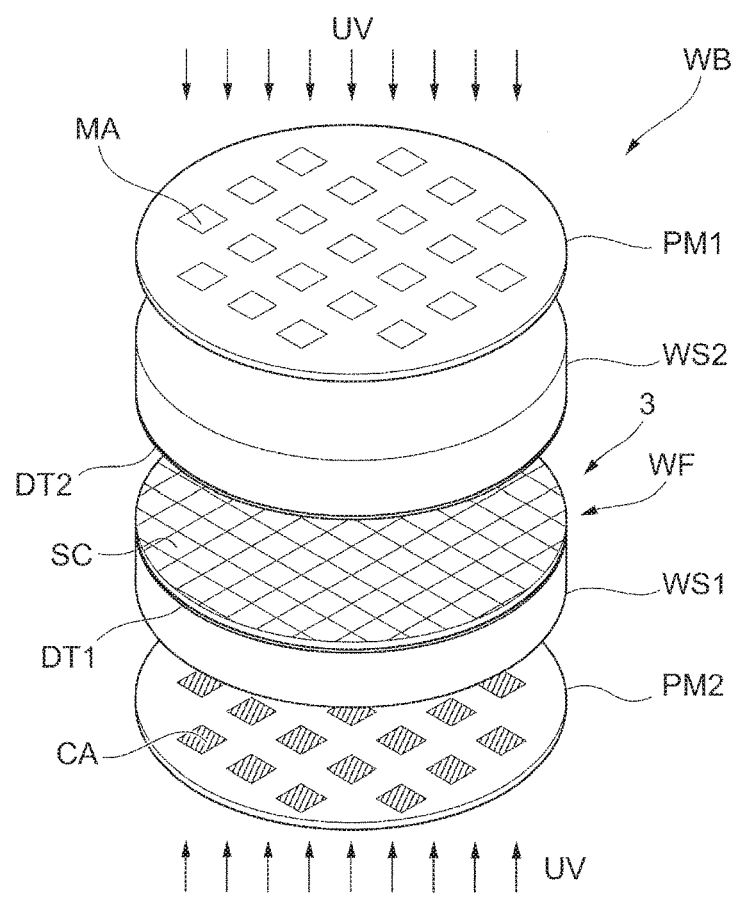
FIGS. 3A and 3B depict a schematic view and a sectional side view, respectively, of the semiconductor chips at the second step of the fabrication process according to the exemplary embodiment.
Figure 3B:
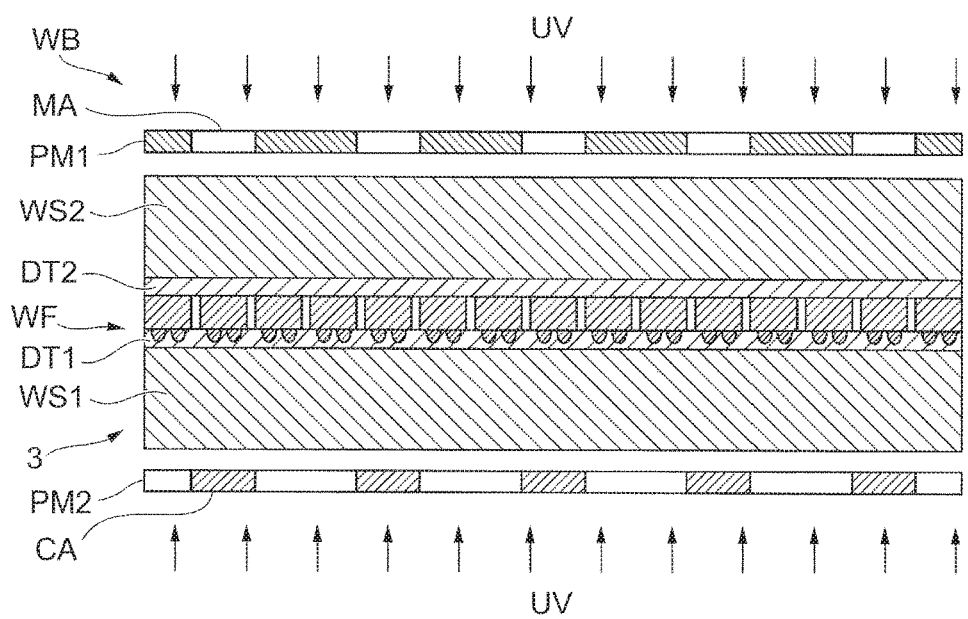

Referring to FIGS. 3A and 3B, there are shown a schematic view and a sectional side view, respectively, of the semiconductor chips SC at the second step of the fabrication process according to the exemplary embodiment. At this step, a second wafer support WS2 is applied on an upper side of the wafer WF with a second dicing tape DT2. The second wafer support WS2 is a glass substrate (plate) transmitting UV light. The second dicing tape DT2 is provided with a UV-curable adhesive.

The second wafer support WS2 is provided with a first photo mask PM1 on an upper side of the second wafer support WS2. The first photo mask PM1 is provided with apertures MA whose positions correspond to the semiconductor chips SC that are to remain on the first wafer support WS1 at this process. Similarly, a second photo mask PM2 is applied on a lower side of the first wafer support WS1. The second photo mask PM2 is provided with cover areas CA whose positions correspond to the semiconductor chips SC that are to remain on the first wafer support WS1 at this process. In other words, the second photo mask PM2 allows UV light to pass an area other than the cover areas CA.

Then the second dicing tape DT2 is irradiated with UV light through the apertures MA of the first photo mask PM1, so that adhesive force between the second dicing tape DT2 and the semiconductor chips SC in positions corresponding to the apertures MA reduces. Similarly, the first dicing tape DT1 is irradiated with UV light through the second photo mask PM2. This reduces adhesive force between the first dicing tape DT1 and the semiconductor chips SC in the area other than the cover areas CA.

The wafer WF with the first wafer support WS1 and the second wafer support WS2 sandwiching the wafer WF (hereinafter called the "wafer body WB") is then picked up by the first transfer device 4 and transferred to the debonding device 5. More specifically, the first transfer device 4 places the wafer body WB in a predetermined position (a recess 551, described later) in the debonding device 5. The wafer body WB is an example of a carrier body.

Note that the semiconductor chips SC to remain on the first wafer support WS1 at this process are hereinafter called "target chips TC". The other semiconductor chips SC other than the target chips TC, i.e. the semiconductor chips SC to be peeled off from the first wafer support WS1 at this process are hereinafter called "other chips OC". After the UV irradiation, the first photo mask PM1 and the second photo mask PM2 may be removed by dry etching, for example. Note that after the UV irradiation, the adhesive force (a first adhesive force) between the first dicing tape DT1 and the other chips OC is smaller than the adhesive force (a second adhesive force) between the first dicing tape DT1 and the target chips TC. Similarly, after the UV irradiation, the adhesive force (a third adhesive force) between the second dicing tape DT2 and the other chips TC is larger than the adhesive force (a fourth adhesive force) between the second dicing tape DT2 and the target chips TC.

Figure 4A:
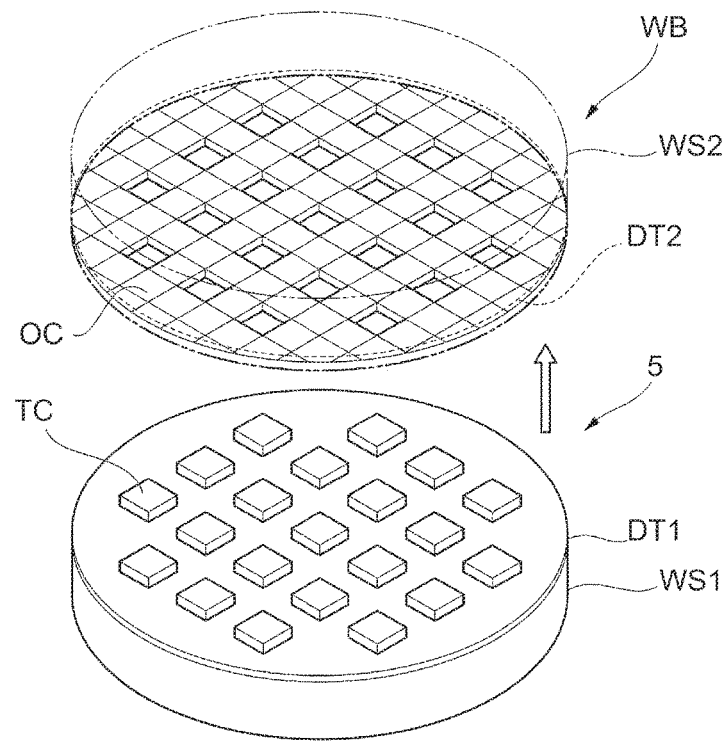
FIGS. 4A and 4B depict a schematic view and a sectional side view, respectively, of the semiconductor chips at the third step of the fabrication process according to the exemplary embodiment.
Figure 4B:
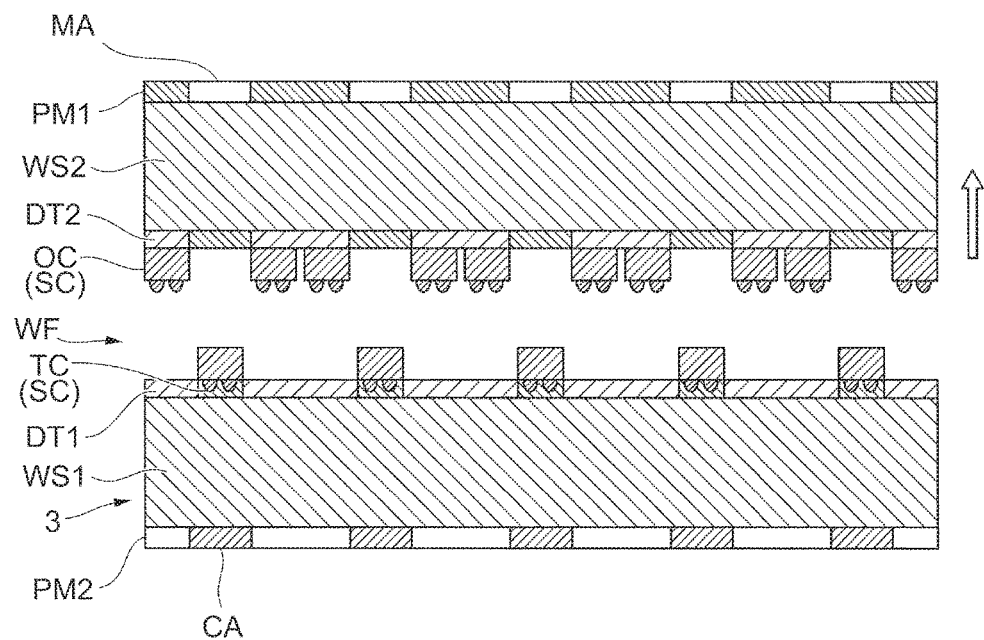

Referring to FIGS. 4A and 4B, there are shown a schematic view and a sectional side view, respectively, of the semiconductor chips SC at the third step of the fabrication process according to the exemplary embodiment. At this step, the second wafer support WS2 moves away from the first wafer support WS1 to pick up the other chips OC while the target chips TC remain on the first wafer support WS1. In other words, the second wafer support WS2 picks up the other chips OC from the semiconductor chips SC on the first wafer support WS1 to conduct a partial chip transfer. Note that the other chips OC adhering to the second wafer support WS2 with the second dicing tape DT2 are held in an identical plane. Further, the second wafer support WS2 moves in a direction perpendicular to the first wafer support WS1 (the second wafer support WS2).

Figure 5A:
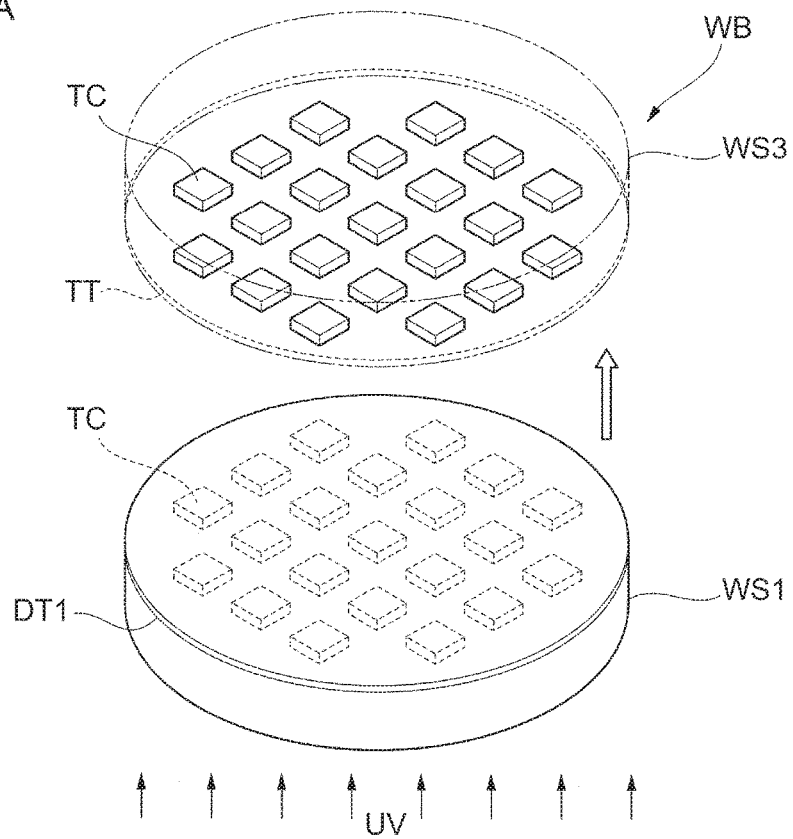
FIGS. 5A and 5B depict a schematic view and a sectional side view, respectively, of the semiconductor chips at the fourth step of the fabrication process according to the exemplary embodiment.
Figure 5B:
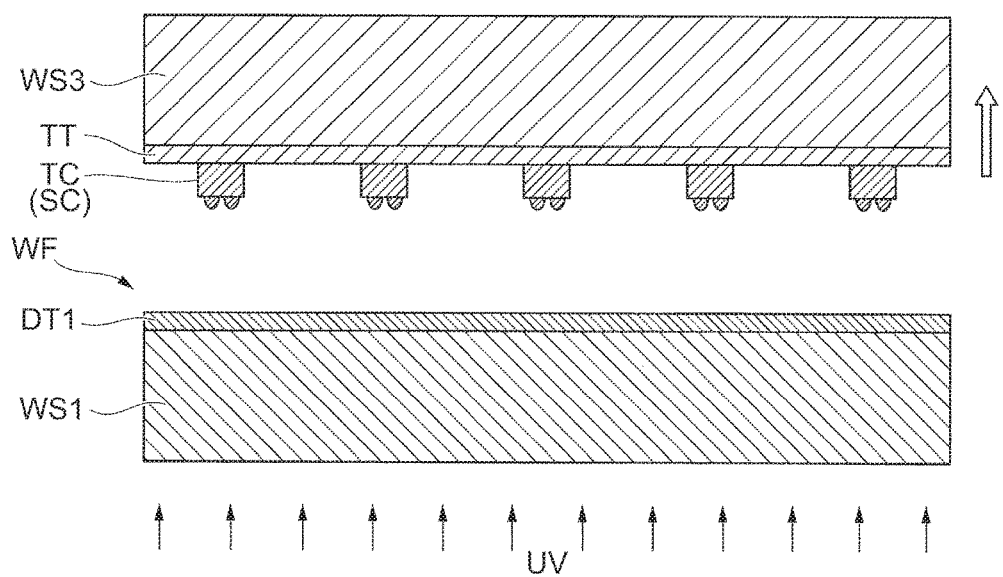

Referring to FIGS. 5A and 5B, there are shown a schematic view and a sectional side view, respectively, of the semiconductor chips SC at the fourth step of the fabrication process according to the exemplary embodiment. At this step, the first dicing tape DT1 is irradiated with UV light through the first wafer support WS1, so that adhesive force between the first dicing tape DT1 and the target chips TC reduces. A third wafer support WS3 is then moved by the second transfer device 6. Note that the third wafer support WS3 is provided with a transfer tape TT on a lower surface of the third wafer support WS3 to hold the target chips TC. This configuration enables the second transfer device 6 to convey the multiple semiconductor chips (the target chips TC) to the bonding device 7 at one stroke. Note that the adhesive of the transfer tape TT may be a heat resistant adhesive, for example.

The third wafer support WS3 firstly moves towards the first wafer support WS1 from above so that the transfer tape TT contacts the target chips TC remaining on the first wafer support WS1. The third wafer support WS3 then moves away from the first wafer support WS1 to pick up the target chips TC. Note that the target chips TC adhering to the transfer tape TT are held in an identical plane. Then the third wafer support WS3 holding the target chips TC is transferred to the bonding device 7 by the second transfer device 6.

Figure 6A:
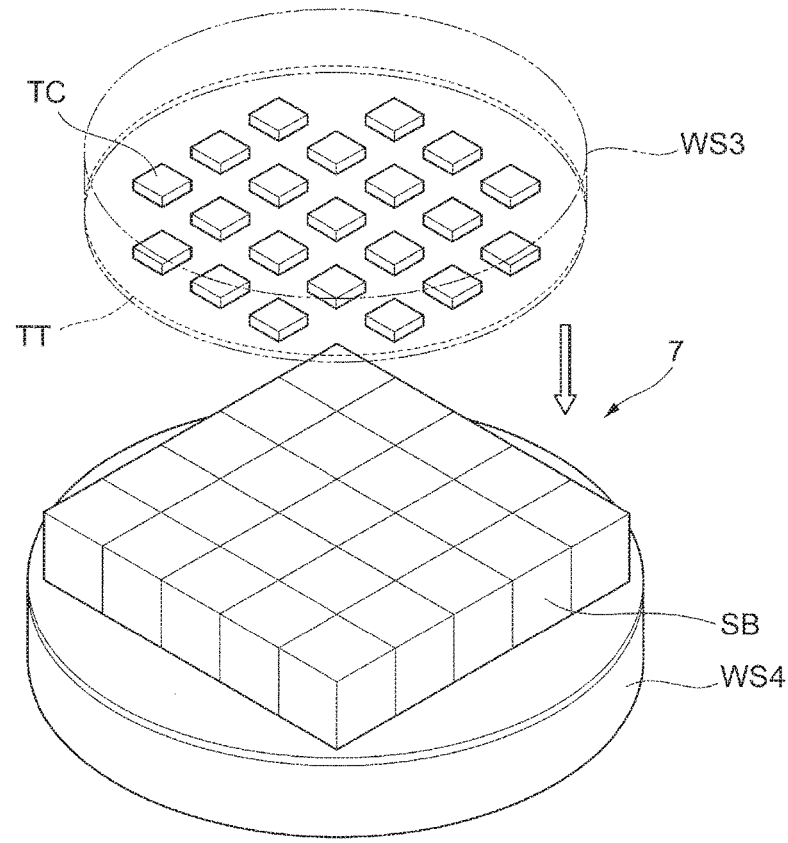
FIGS. 6A and 6B depict a schematic view and a sectional side view, respectively, of the semiconductor chips at the fifth step of the fabrication process according to the exemplary embodiment.
Figure 6B:
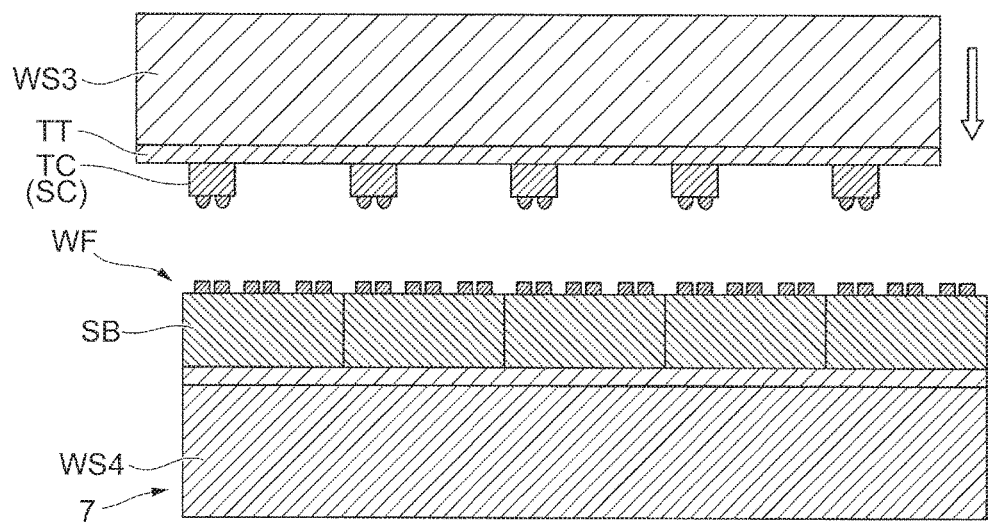

Referring to FIGS. 6A and 6B, there are shown a schematic view and a sectional side view, respectively, of the semiconductor chips SC at the fifth step of the fabrication process according to the exemplary embodiment. At this step, the third wafer support WS3 holding the target chips TC moves towards the fourth wafer support WS4 from above. The fourth wafer support WS4 holds substrates SB on its upper side, so that the target chips TC contacts the substrates SB to bond thereto. This enables to bond multiple (many) target chips TC to the substrates SB at one stroke (simultaneously).

If the other chips OC on the second wafer support WS2 are needed to be picked up, the above operation is repeated.

Here, as mentioned above with reference to FIGS. 4A and 4B, the debonding device 5 debonds the other chips OC adhering to the second wafer support WS2 from the first wafer support WS1. To put it the other way around, the debonding device 5 debonds the target chips TC adhering to the first wafer support WS1 from the second wafer support WS2. Note that the first wafer support WS1 and the second wafer support WS2 are rigid components to prevent the semiconductor chips SC (the target chips TC and the other chips OC) from hitting each other, for maintaining high alignment accuracy.

However, once the two rigid carriers, i.e. the first wafer support WS1 and the second wafer support WS2 are adhered by UV release tape, i.e. the first dicing tape DT1 and the second dicing tape DT2, existing peeling methods or vacuum debonding methods cannot be applied due to rigidity of the carriers or large adhesion strength between the two rigid carriers. For example, in the vacuum debonding method, the carriers are held using vacuum force. However, the vacuum force applied to the carriers can be less than the adhesion strength of the UV release tape. This may result in a failure of the debonding process.

In the present exemplary embodiment, the debonding device 5 uses air pressure in addition to the vacuum force. A detailed explanation of the debonding device 5 is given below.

Figure 7A:
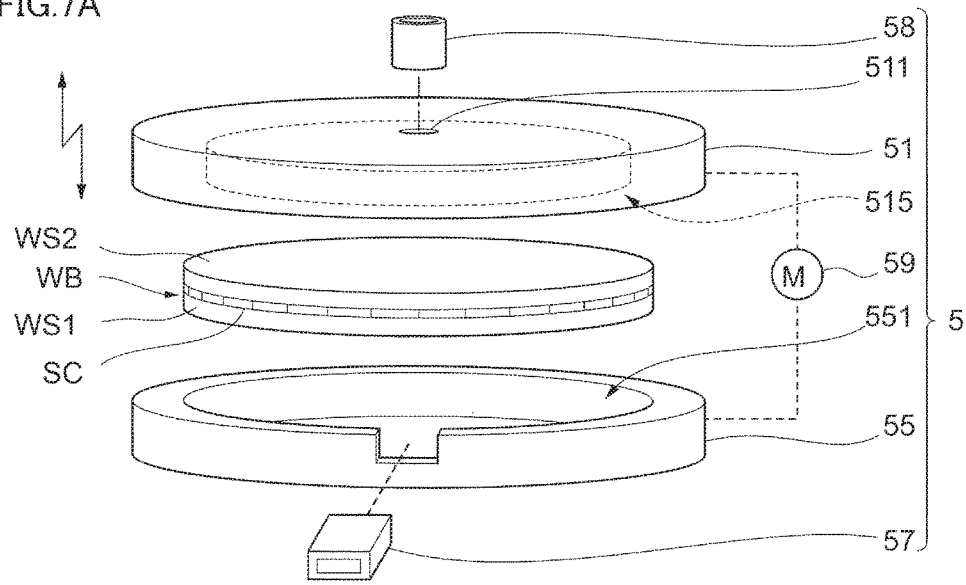
FIG. 7A depicts a schematic view of a configuration of the debonding device according to the exemplary embodiment.
Figure 7B:
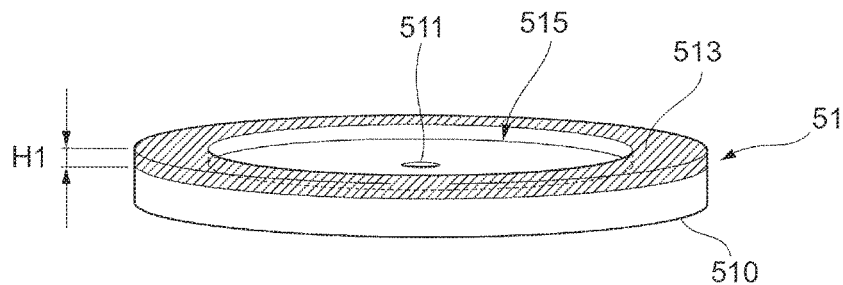
FIG. 7B depicts a schematic view of a configuration of an upper carrier.
Figure 7C:
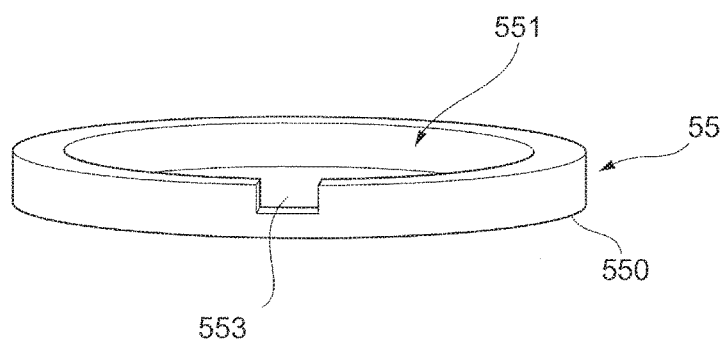
FIG. 7C depicts a schematic view of a configuration of a lower carrier.
Figure 7D:
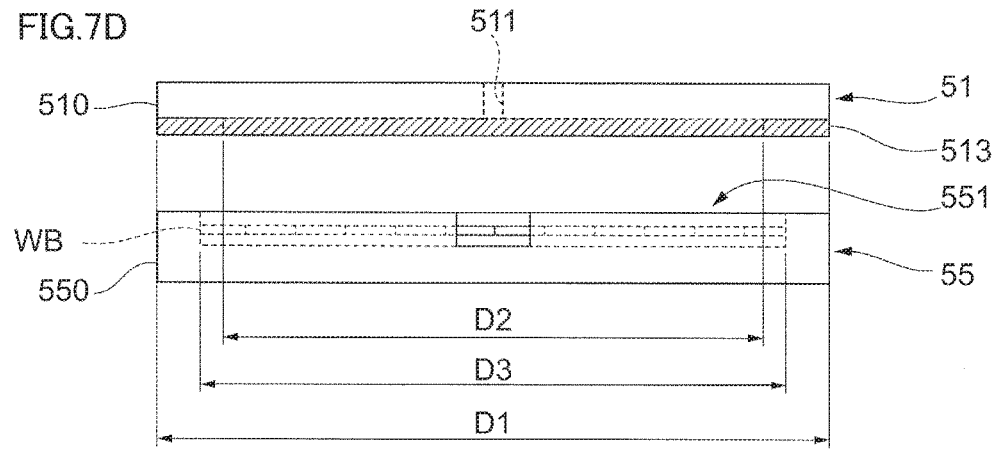
FIG. 7D depicts a sectional side view of the upper carrier and the lower carrier.
Figure 7E:
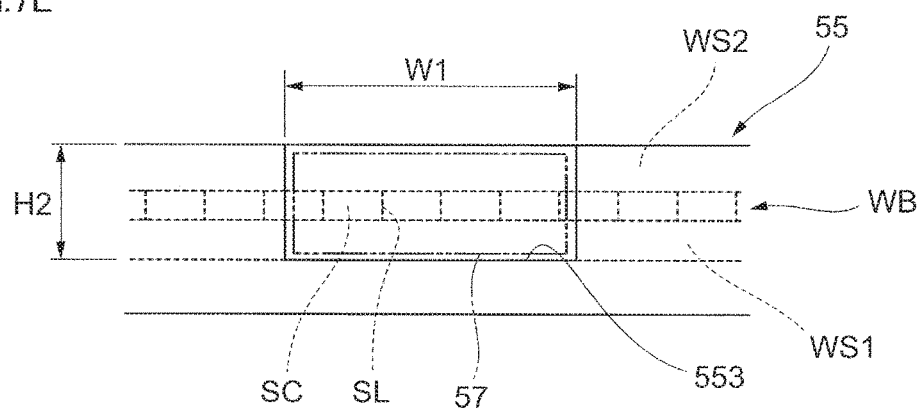
FIG. 7E depicts a side view of an air inlet.
Figure 7F:
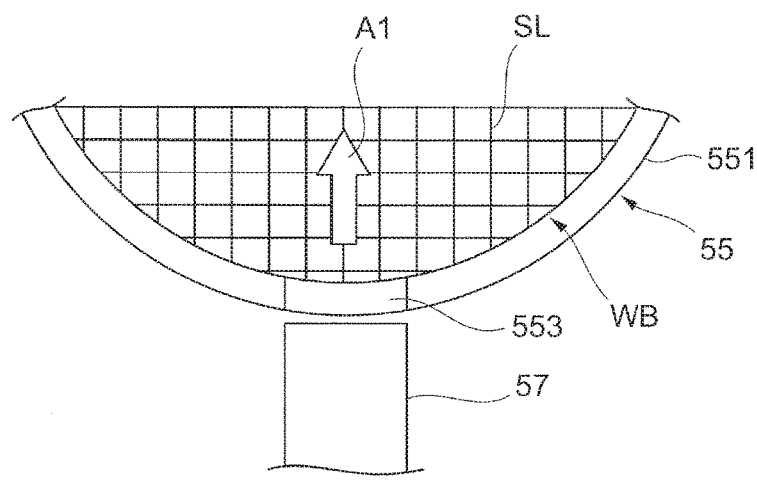
FIG. 7F depicts a top view of the air inlet and an air nozzle.

FIG. 7A depicts a schematic view of a configuration of the debonding device 5 according to the exemplary embodiment. FIG. 7B depicts a schematic view of a configuration of an upper carrier 51. Note that FIG. 7B shows the upper carrier 51 upside down from FIG. 7A. FIG. 7C depicts a schematic view of a configuration of a lower carrier 55. FIG. 7D depicts a sectional side view of the upper carrier 51 and the lower carrier 55. FIG. 7E depicts a side view of an air inlet 553. FIG. 7F depicts a top view of the air inlet 553 and an air nozzle 57.

As shown in FIG. 7A, the debonding device 5 may include an upper carrier (upper tool) 51, a lower carrier (bottom tool) 55, an air nozzle 57, a vacuum pipe 58, and a driving mechanism 59. As shown in FIG. 7A, the wafer body WB is sandwiched by the upper carrier 51 and the lower carrier 55. The driving mechanism 59 drives the upper carrier 51 to debond the semiconductor chips SC from the first wafer support WS1. The upper carrier 51 holds the second wafer support WS2 using vacuum force via the vacuum pipe 58 and air pressure via the air nozzle 57.

The upper carrier 51 is an example of a second member. The lower carrier 55 is an example of a first member. The first wafer support WS1 is an example of a first plate. The second wafer support WS2 is an example of a second plate.

As shown in FIG. 7B, the upper carrier 51 may include an upper plate member 510 and a sealing rubber 513. The upper plate member 510 has a generally round shape in a plane view. In other words, the upper plate member 510 has a generally disc shape. The upper plate member 510 may be made of metal, such as aluminum or stainless steel. The upper plate member 510 is provided with a through hole, namely a vacuum chuck hole 511 at the center of the surface of the upper plate member 510. The sealing rubber 513 is provided on the surface of the upper plate member 510 facing the lower carrier 55 (an upper surface in FIG. 7B). The sealing rubber 513 has a generally ring shape. The sealing rubber 513 is provided along the edge (an outer edge) of the upper plate member 510, so that a room, namely a recess 515 is defined on the side of the upper carrier 51 facing the lower carrier 55. Note that the sealing rubber 513 is an example of a pressing part. The recess 515 is an example of another recess.

The vacuum chuck hole 511 communicates with the recess 515. The height H1 of the sealing rubber 513 is less than 0.5 mm. In other words, the depth of the recess 515 is less than 0.5 mm. In the example shown in the figure, the sealing rubber 513 has a generally flat surface facing the lower carrier 55 (an upper surface in FIG. 7B).

As shown in FIG. 7C, the lower carrier 55 may include a lower plate member 550. The lower plate member 550 has a generally round shape in a plane view. The lower plate member 550 may be made of metal, such as aluminum or stainless steel. The lower plate member 550 is provided with a recess 551 on the surface facing the upper carrier 51 (an upper surface in FIG. 7C). The recess 551 is for accommodating the wafer body WB. The lower plate member 550 is provided with an air inlet 553 on the outer surface (on the edge) of the lower plate member 550. The air inlet 553 communicates with the recess 551, forming a flow path of pressurized air (described later) into the recess 551. Here, the first wafer support WS1 of the wafer body WB received in the recess 551 is opposed to a bottom of the recess 551.

Hereinafter, the dimension of each component of the debonding device 5 will be explained. As shown in FIG. 7D, the upper plate member 510 and the lower plate member 550 have substantially the same outer diameter (refer to diameter D1). In other words, the sealing rubber 513 and the lower plate member 550 have substantially the same outer diameter. Further, the sealing rubber 513 has a smaller inner diameter (refer to diameter D2) than the inner diameter of the recess 551 (refer to diameter D3). Note that the inner diameter of the recess 551 is substantially equal to the outer diameter of the wafer body WB. That is to say, the outer diameter of the wafer body WB is larger than the inner diameter of the sealing rubber 513. The diameters can be expressed as follows:

Inner diameter of sealing rubber 513 (diameter D2) < outer diameter of wafer body WB (diameter D3) < outer diameter of sealing rubber 513 (diameter D1)

The above configuration enables the sealing rubber 513 to hold (press) the outer edge of the wafer body WB received (inserted) in the recess 551 of the lower carrier 55. Further, the sealing rubber 513 seals a gap (a room) between the outer surface of the wafer body WB and the inner surface of the recess 551. That is to say, the sealing rubber 513 prevents air from flowing out via the gap between the outer surface of the wafer body WB and the inner surface of the recess 551. Note that the above configuration enables the upper plate member 510 (the upper carrier 51) to cover the recess 551 of the lower carrier 55.

As shown in FIGS. 7A and 7E, the air inlet 553 has a generally rectangular parallelepiped shape. The width W1 (refer to FIG. 7E) of the air inlet 553 is larger than the size of each semiconductor chip SC in the wafer body WB. For example, the width W1 is 10 mm to 20 mm and the size of the semiconductor chip SC is less than 5 mm, as mentioned above. Further, the air inlet 553 and the wafer body WB have substantially the same height (refer to height H2 in FIG. 7E). For example, the height H2 is 2 mm. The air inlet 553 is opposed to the outer surface of the wafer body WB. More specifically, the air inlet 553 is opposed to a gap between the first wafer support WS1 and the second wafer support WS2.

Here, as shown in FIGS. 7E and 7F, the air nozzle 57 is arranged to be opposed to the air inlet 553. That is to say, the air nozzle 57 is opposed to the gap between the first wafer support WS1 and the second wafer support WS2. This enables the air nozzle 57 to blow air (introduce gas) into the gap between the first wafer support WS1 and the second wafer support WS2 via the air inlet 553. The air from the air nozzle 57 passes through the space between the semiconductor chips SC in the gap. The air flows along the surface of the first wafer support WS1 (the second wafer support WS2). More specifically, the air flows along the scribed lines SL.

As shown in FIG. 7F, the air nozzle 57 (the air inlet 553) is arranged to blow air (the pressurized air) in the direction (refer to an arrow A1 in FIG. 7E) along one set of lines in the scribed lines SL. Further, the air nozzle 57 (the air inlet 553) is opposed to multiple lines of the scribed lines SL. This enables the air to smoothly spread in the gap between the first wafer support WS1 and the second wafer support WS2.

As shown in FIG. 7A, the vacuum pipe 58 is provided over the vacuum chuck hole 511. The vacuum pipe 58 communicates with the recess 515 through the vacuum chuck hole 511. This configuration enables to vacuum the recess 515.

As shown in FIG. 7A, the driving mechanism 59 may include a motor M. The driving mechanism 59 changes a relative distance (relative position) between the upper carrier 51 and the lower carrier 55. In the example shown in the figure, the driving mechanism 59 moves the upper carrier 51 and the vacuum pipe 58 by driving force from the motor M.

Here, as explained above with reference to FIG. 3A, the first dicing tape DT1 and the second dicing tape DT2 are irradiated with UV light using the first photo mask PM1 and the second photo mask PM2. Although the adhesion strength of irradiated areas of the first dicing tape DT1 and the second dicing tape DT2 decreases, the adhesion strength may not become zero. The adhesion strength in a vertical direction can be close to 2 kgf/cm$^2$.

The adhesion strength after the UV irradiation is assumed to be 1.66 kgf/cm$^2$. If the pressure generated by the above vacuum operation in the upper carrier 51 is 1.0 kgf/cm$^2$ (atmospheric pressure), the adhesion strength after the UV irradiation is larger than the atmospheric pressure. However, the debonding device 5 is provided with the air inlet 553 and the air nozzle 57, and the air from the air nozzle 57 helps the upper carrier 51 to hold the second wafer support WS2. Assuming that the pressurized air from the air nozzle 57 is 7.0 kgf/cm$^2$ and a percentage of the area occupied by the scribed lines SL on the surface of the wafer WF is 17%, the pressure caused by the pressurized air equals to 1.2 kgf/cm$^2$. The total pressure of the atmospheric pressure (1.0 kgf/cm$^2$) and the pressure caused by the pressurized air (1.2 kgf/cm$^2$) equals to 2.2 kgf/cm$^2$, which is larger than the adhesion strength after the UV irradiation (1.66 kgf/cm$^2$). This enables the debonding device 5 to debond the semiconductor chips SC.

Figure 8:
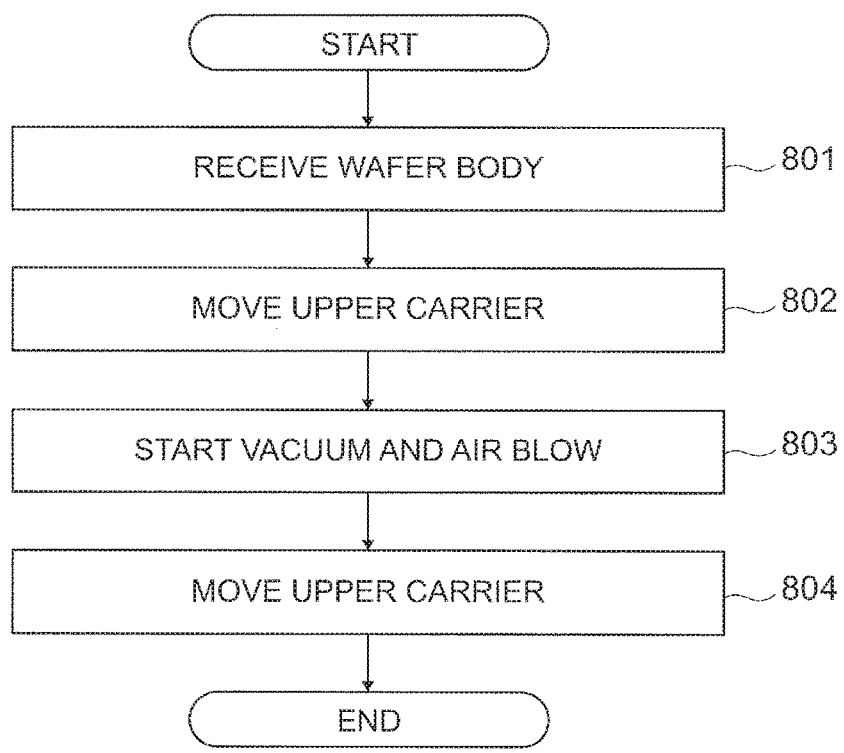
FIG. 8 depicts a flowchart representing an operation of the debonding device according to the exemplary embodiment.

FIG. 8 depicts a flowchart representing an operation of the debonding device 5 according to the exemplary embodiment. FIGS. 9A to 9D depict a sectional view of the wafer body WB at the respective steps of the flowchart shown in FIG. 8. Referring to FIGS. 8 and 9A to 9D, the operation of the debonding device 5 will be described. Note that the upper carrier 51 (not shown in FIG. 9A) is assumed to be on a position being away from the lower carrier 55.

Figure 9A:
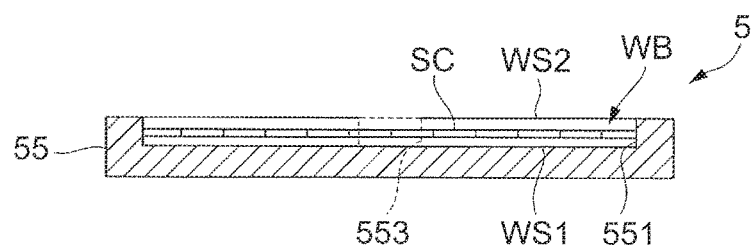
FIGS. 9A, 9B, 9C and 9D depict a sectional view of the wafer body at the respective steps of the flowchart shown in FIG. 8.

The debonding device 5 first receives the wafer body WB from the first transfer device 4 (step 801). More specifically, as shown in FIG. 9A, the recess 551 of the lower carrier 55 receives the wafer body WB. The first wafer support WS1 of the wafer body WB is supported by the lower carrier 55.

Figure 9B:
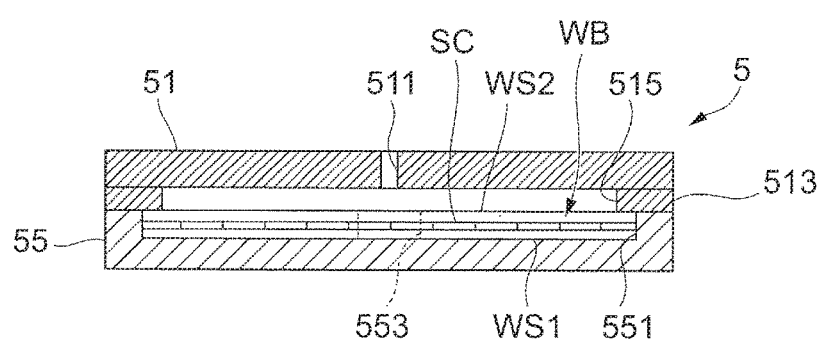

The upper carrier 51 then moves towards the lower carrier 55 (step 802). More specifically, as shown in FIG. 9B, the upper carrier 51 sandwiches the wafer body WB with the lower carrier 55 to press the outer edge of the wafer body WB by the sealing rubber 513. Note that the sealing rubber 513 seals the gap between the outer surface of the wafer body WB and the inner surface of the recess 551.

Figure 9C:
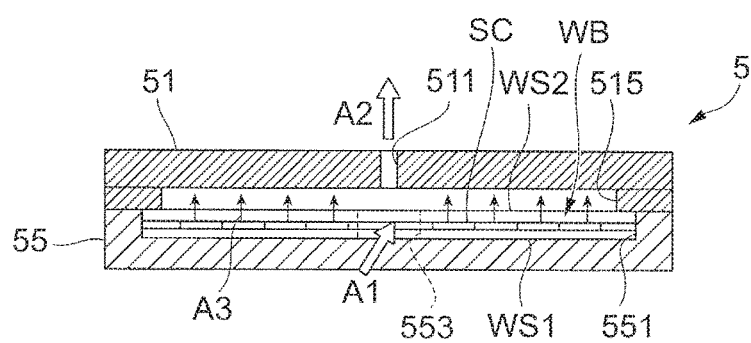

The vacuum pipe 58 (refer to FIG. 7A) then starts to vacuum the recess 515 and the air nozzle 57 starts to blow the air (step 803). As shown in FIG. 9C, the air blown from the air nozzle 57 spreads in the gap between the first wafer support WS1 and the second wafer support WS2, so that the air in the gap pushes the second wafer support WS2 towards the upper carrier 51 (refer to arrows A3). This enables to help the upper carrier 51 to hold the second wafer support WS2 using the vacuum.

Figure 9D:
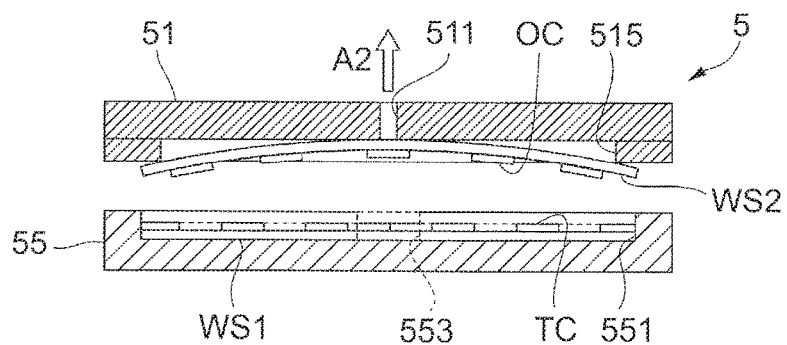

The upper carrier 51 then moves away from the lower carrier 55 (step 804). As shown in FIG. 9D, the upper carrier 51 holds the second wafer support WS2 at this step. Further, the other chips OC adhere to the second wafer support WS2. By moving the upper carrier 51, the other chips OC are debonded from the first wafer support WS1. In the example shown in the figure, the air pressure of the recess 515, i.e., internal pressure of the recess 515, is lower than the pressure in the atmosphere, so that the second wafer support WS2 is curved. This prompts the other chips OC (the semiconductor chips SC) to be debonded from the first wafer support WS1.

Here, as shown in FIG. 9C, when the upper carrier 51 holds the second wafer support WS2, the second wafer support WS2 and the sealing rubber 513 prevent the air in the gap between the first wafer support WS1 and the second wafer support WS2 from flowing into the recess 515. In other words, the gap between the first wafer support WS1 and the second wafer support WS2 is isolated from the recess 515.

Note that the debonding device 5 is assisted by both vacuum and air pressure, which is gradually added from the air inlet 553 located at the edge of the lower carrier 55.

The position of the upper carrier 51 shown in FIG. 9B is a position close to the lower carrier 55.

Figure 10A:
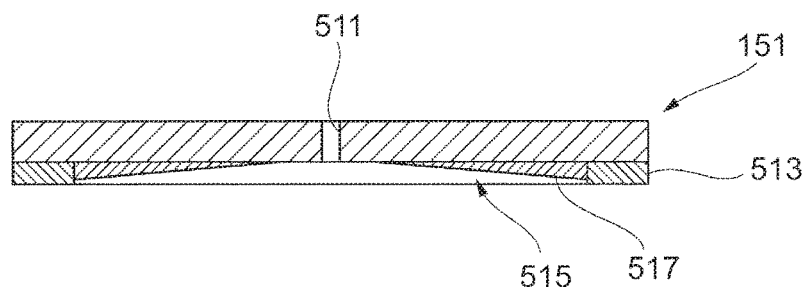
FIG. 10A depicts a sectional view of an upper carrier according to the second exemplary embodiment.
Figure 10B:
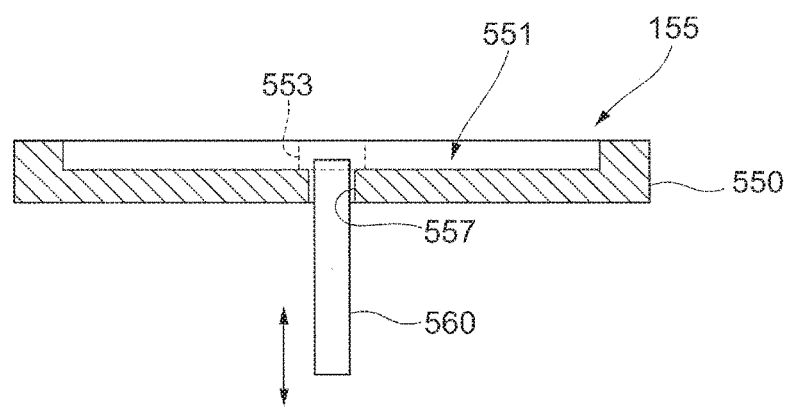
FIG. 10B depicts a sectional view of a lower carrier according to the third exemplary embodiment.
Figure 10C:
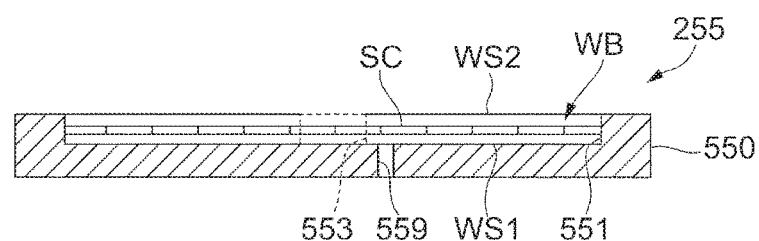
FIG. 10C depicts a sectional view of a lower carrier according to the fourth exemplary embodiment.
Figure 10D:
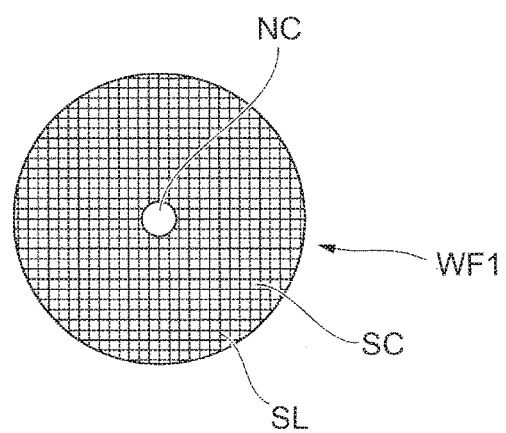
FIG. 10D depicts a top view of a wafer according to the fifth exemplary embodiment.

FIG. 10A depicts a sectional view of an upper carrier 151 according to the second exemplary embodiment. FIG. 10B depicts a sectional view of a lower carrier 155 according to the third exemplary embodiment. FIG. 10C depicts a sectional view of a lower carrier 255 according to the fourth exemplary embodiment. FIG. 10D depicts a top view of a wafer WF1 according to the fifth exemplary embodiment. In FIGS. 10A to 10D, the same structures as those of the above exemplary embodiment are denoted by the same reference numerals, and the detailed explanation thereof will be omitted.

The debonding device 5 and the wafer body WB are not limited to the configuration of the above exemplary embodiment. For example, as shown in FIG. 10A, the upper carrier 151 may be provided with a protection pad 517 on the bottom of the recess 515. In other words, the protection pad 517 may be provided inside of the sealing rubber 513. The protection pad 517 has generally a ring shape. The protection pad 517 decreases its thickness in a direction toward the center of the ring shape. The protection pad 517 may be made of rubber, for example. The protection pad 517 prevents breakage of the second wafer support WS2 being in a curved shape.

As shown in FIG. 10B, the lower plate member 550 may be provided with a through hole 557 at the center of the lower plate member 550. Further, the lower carrier 155 may be provided with a push bar 560 movably inserted in the through hole 557. After the debonding process as shown in FIG. 9D, the push bar 560 pushes the lower side of the first wafer support WS1. This facilitates a process of removing the first wafer support WS1 from the recess 551.

As shown in FIG. 10C, the lower plate member 550 may be provided with a through hole 559. The hole 559 communicates with the recess 511, forming an air flow path. The hole 559 allows applying both vacuum pressure and air pressure to the wafer body WB received in the recess 551 of the lower carrier 55. Specifically, in the debonding process as shown in FIG. 9C, the hole 559 vacuums the space between the bottom of the recess 551 and the lower side of the first wafer support WS1 to hold the lower side of the first wafer support WS1. After the debonding process as shown in FIG. 9D, the hole 559 blows the pressurized air to push the lower side of the first wafer support WS1.

As shown in FIG. 10D, the wafer WF1 may be provided with a no chip area NC where the semiconductor chips SC are not provided. In other words, the no chip area NC is an etched area provided in a predetermined area of the wafer WF1. In the shown example, the no chip area NC is provided at the center of the wafer WF1. When the air nozzle 57 blows the pressurized air as shown in FIG. 9C, the air can flow into the no chip area NC. Since the air in the no chip area NC pushes the second wafer support WS2 more strongly than other areas, the debonding starts from the semiconductor chips SC located around the no chip area NC. This can control a start point of the debonding process, namely an initial carrier debonding point.

In the above exemplary embodiments, one set of the air inlet 553 and the air nozzle 57 is provided on the lower carrier 55. Instead of this configuration, multiple sets of the air inlet 553 and the air nozzle 57 may be provided on the lower carrier 55.

In the above exemplary embodiments, the air inlet 553 has a generally rectangular parallelepiped shape. The shape of the air inlet 553 is not limited to this as long as the pressurized air can flow into the gap between the first wafer support WS1 and the second wafer support WS2. For example, the air inlet 553 may have a cylindrical shape or a cone shape.

In the above exemplary embodiments, the sealing rubber 513 is provided on the upper carrier 51. As long as the upper carrier 51 is provided with the recess 515 and can press the outer edge of the wafer body WB, the sealing rubber 513 can be omitted.

In the above exemplary embodiments, the dicing device 3 cuts the wafer WF by reactive ion etching. However, other conventional cutting techniques, such as blade or laser cutting, are also applicable to the dicing device 3.

In the above exemplary embodiments, the vacuum pipe 58 starts to vacuum the recess 515 when the air nozzle 57 starts to blow the air (step 803). The start timing of vacuuming the recess 515 and blowing the air is not necessarily at the same timing. That is to say, the vacuum pipe 58 may start to vacuum the recess 515 after (or before) the air nozzle 57 starts to blow the air.

In the above exemplary embodiments, the driving mechanism 59 moves the upper carrier 51. As long as the driving mechanism 59 changes the relative distance between the upper carrier 51 and the lower carrier 55, the driving mechanisms 59 may move the lower carrier 55 instead of the upper carrier 51. Further, the driving mechanisms 59 may move the upper carrier 51 and the lower carrier 55.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A debonding device comprising:
a first member provided with a recess for receiving a carrier body, the carrier body including a first plate, a second plate, and a plurality of semiconductor chips, the semiconductor chips being sandwiched between the first plate and the second plate, the first plate being opposed to a bottom of the recess; and
a second member having a location figured to change with respect to the first member, wherein
the second member holds the second plate using a vacuum suction in a position; and
the first member is provided with an inlet to introduce gas into a gap between the first plate and the second plate.
2. The debonding device of claim 1, wherein
the second member is configured to cover the recess of the first member in the position opposite to the first member,
the second member is provided with a pressing part on a side of the second member opposed to the carrier body along an outer edge of the second plate, and
the pressing part is configured to press the outer edge of the second plate.
3. The debonding device of claim 2, wherein
the second member comprises a plate member having a generally disc shape,
the pressing part has a generally ring shape provided along an outer edge of the plate member, and
an outer diameter of the second plate is larger than an inner diameter of the pressing part and smaller than an outer diameter of the pressing part.

4. The debonding device of claim 3, wherein
the pressing part seals a room between an outer surface of the second plate and an inner surface of the recess of the first member.
5. The debonding device of claim 2, wherein
the second member is provided with another recess on the side of the second member opposed to the carrier body,
the another recess is provided inside of the pressing part, and
the second member is configured to hold the second plate by reducing internal pressure of the another recess by the vacuum suction.
6. The debonding device of claim 1, wherein
the inlet is provided on an outer surface of the first member to communicate with the recess of the first member.
7. The debonding device of claim 1, further comprising a nozzle configured to blow out a pressure gas via the inlet to the gap between the first plate and the second plate of the carrier body received in the recess of the first member, the pressure gas having higher pressure than atmospheric pressure.
8. The debonding device of claim 1, wherein
the plurality of semiconductor chips are provided in an array on the first plate, and
gas introduced from the inlet flows through a space between the plurality of semiconductor chips.
9. The debonding device of claim 1, wherein
a part of the plurality of semiconductor chips are to be debonded from the first plate, and
a first adhesive force between the part of the plurality of semiconductor chips and the first plate is smaller than a second adhesive force between another part of the plurality of semiconductor chips and the first plate, the another part of the plurality of semiconductor chips being to remain on the first plate.
10. The debonding device of claim 1, wherein
a part of the plurality of semiconductor chips are to be debonded from the first plate, and
a third adhesive force between the part of the plurality of semiconductor chips and the second plate is larger than a fourth adhesive force between another part of the plurality of semiconductor chips and the second plate, the another part of the plurality of semiconductor chips being to remain on the first plate.
11. A semiconductor manufacturing system comprising:
a debonding device configured to debond a plurality of semiconductor chips in a carrier body, the carrier body including a first plate, a second plate, and the plurality of semiconductor chips being sandwiched between the first plate and the second plate; and
a bonding device configured to bond the plurality of semiconductor chips on substrates, wherein
the debonding device comprises:
a first member provided with a recess for receiving the carrier body, the first plate of the carrier body received in the recess being opposed to a bottom of the recess; and
a second member having a location configured to change with respect to the first member,
the second member holds the second plate using a vacuum suction in a position; and
the first member is provided with an inlet to introduce gas into a gap between the first plate and the second plate.
12. A method for debonding a plurality of semiconductor chips, the method comprising:
receiving a carrier body in a recess provided in a first member, the carrier body including a first plate, a second plate, and the plurality of semiconductor chips, the semiconductor chips being sandwiched between the first plate and the second plate, the first plate of the carrier body received in the recess being opposed to a bottom of the recess;
moving at least one of the first member and a second member closer to each other;
holding the second plate of the carrier body received in the recess of the first member by the second member using a vacuum suction; and
blowing gas into a gap between the first plate and the second plate of the carrier body received in the recess of the first member.

* * * * *